(12) United States Patent
Lee et al.

(10) Patent No.: US 6,555,865 B2
(45) Date of Patent: Apr. 29, 2003

(54) NONVOLATILE SEMICONDUCTOR MEMORY DEVICE WITH A MULTI-LAYER SIDEWALL SPACER STRUCTURE AND METHOD FOR MANUFACTURING THE SAME

(75) Inventors: Joon-Sung Lee, Seoul-si (KR); Woon-Kyung Lee, Kyungki-do (KR)

(73) Assignee: Samsung Electronics Co. Ltd., Suwon (KR)

( * ) Notice: Subject to any disclaimer, the term of this patent is extended or adjusted under 35 U.S.C. 154(b) by 0 days.

(21) Appl. No.: 09/902,820

(22) Filed: Jul. 10, 2001

(65) Prior Publication Data

US 2003/0011017 A1 Jan. 16, 2003

(51) Int. Cl.[7] ................... H01L 29/76; H01L 29/788; H01L 23/58
(52) U.S. Cl. .................. 257/314; 257/315; 257/320; 257/321; 257/637; 257/640; 257/324
(58) Field of Search .................. 257/314, 315, 257/320, 321, 637, 640, 324

(56) References Cited

U.S. PATENT DOCUMENTS

| | | | |
|---|---|---|---|
| 5,234,850 A | | 8/1993 | Liao et al. |
| 5,453,634 A | | 9/1995 | Mori |
| 5,604,367 A | * | 2/1997 | Yang ........................... 257/321 |
| 5,949,706 A | * | 9/1999 | Chang et al. ................ 365/156 |
| 6,001,687 A | | 12/1999 | Chu et al. |
| 6,031,264 A | * | 2/2000 | Chien et al. ................. 257/315 |
| 6,144,071 A | | 11/2000 | Gardner et al. |

* cited by examiner

Primary Examiner—Eddie Lee
Assistant Examiner—Joseph Nguyen
(74) Attorney, Agent, or Firm—Marger Johnson & McCollom P.C.

(57) ABSTRACT

The present invention provides a nonvolatile memory device having high reliability with novel sidewall spacer structures. The gate stack structure for use in a nonvolatile memory device comprises a semiconductor substrate, a gate stack formed on the semiconductor substrate. The gate stack has a sidewall and a top surface. A multi-layer sidewall spacer structure is formed on the sidewall of the gate stack. The multi-layer sidewall spacer structure includes a first oxide layer, a first nitride layer, a second oxide layer, and a second nitride layer that are sequentially stacked. With the present invention, even if the second nitride layer is perforated or damaged during the formation of contact holes, sidewalls of the gate stack of nonvolatile memory cell can be protected with the first nitride layer from mobile ions. Also, etching damage to source/drain regions or field regions can be reduced.

24 Claims, 12 Drawing Sheets

Fig. 1

(Prior Art)

Fig. 2

(Prior Art)

NONVOLATILE SEMICONDUCTOR MEMORY DEVICE WITH A MULTI-LAYER SIDEWALL SPACER STRUCTURE AND METHOD FOR MANUFACTURING THE SAME

BACKGROUND OF THE INVENTION

1. Field of Invention

This invention related to the field of nonvolatile memory devices, and more particularly, to novel sidewall spacer structures for nonvolatile memory devices.

2. Description of the Related Art

Sidewall spacer structures are widely used in the manufacture of nonvolatile semiconductor memory devices for various reasons, for example, to isolate gate stacks from contact plugs.

One such sidewall spacer structure is disclosed in U.S. Pat. No. 6,001,687. This sidewall spacer structure is formed of silicon nitride and has many problems. For example, stresses occur at the interface between the surface of the silicon substrate and the silicon nitride spacer or between the sidewall of a floating gate formed of polysilicon and the silicon nitride spacer. Such stresses can degrade device characteristics such as charge retention. Also, many trap sites can exist in the silicon nitride spacer, degrading device characteristics such as endurance, reducing the reliability and durability of the nonvolatile memory devices.

Figure 1:
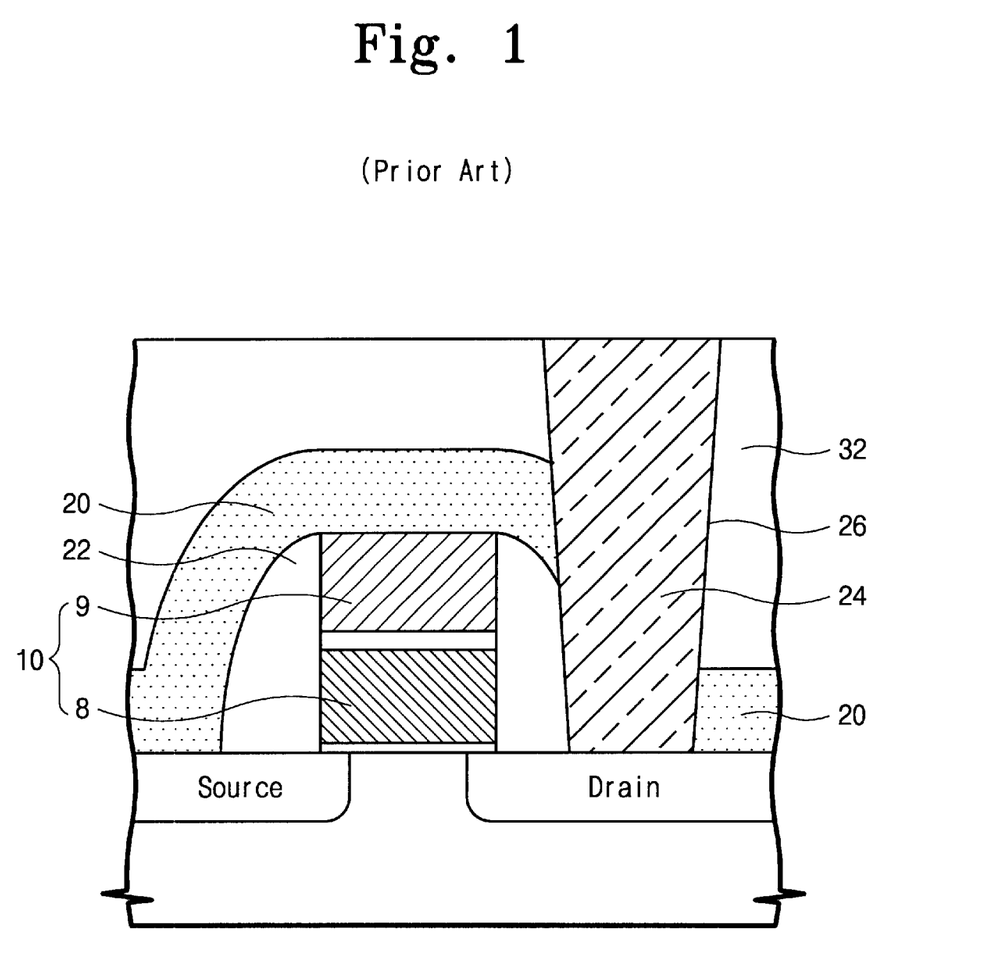
FIG. 1 is a cross-sectional view of a prior art nonvolatile memory device cell structure.

Another sidewall spacer structure of the nonvolatile memory device is disclosed in U.S. Pat. No. 5,453,634. In this structure, as shown in FIG. 1, a silicon nitride layer 20 covers an etched-back oxide sidewall spacer 22 to protect a memory cell from invasion by mobile ions that deteriorate the charge-retention characteristics.

However, such a spacer structure also has several drawbacks. For example, as the integration density of semiconductor device increases, the space between the contact plug 24 and the sidewall spacer 22 becomes smaller and smaller. Consequently, misalignment easily occurs in etching the contact opening. Particularly, during the formation of the contact hole 26, if misalignment occurs, the silicon nitride layer 20 on the sidewall spacers 22 can be perforated or damaged, as illustrated in FIG. 1.

As a result, invasion of mobile ions from the contact hole 26 cannot be effectively prevented. This is a serious problem for the functionality and the reliability of nonvolatile memory devices. Particularly, once the nonvolatile memory device is programmed, it must remain programmed until it is subsequently erased. Therefore, during programming, the electrons trapped in the floating gate 8 should not become neutralized by ingress of charged ions from surrounding structures such as the contact hole 26. However, with such damage to the silicon nitride layer 20 in the prior art, the electrons can get easily neutralized, degrading charge retention characteristics.

Also, substrate pitting can occur during the formation of the etched-back oxide sidewall spacer 22, i.e., anisotropic etching of an oxide layer covering a stacked gate 10. This often leads to a junction leakage problem and also a shallow junction structure cannot be properly achieved.

Additionally, because there is little etch selectivity between the etched-back oxide sidewall spacer 22 and an oxide field region 28 (FIG. 2) during the etching to form the oxide sidewall spacer 22, over-etching of the field region 22 (a field loss or a recessed device isolation region) can occur, exhibiting undesirable device characteristics such as leakage current.

Figure 2:
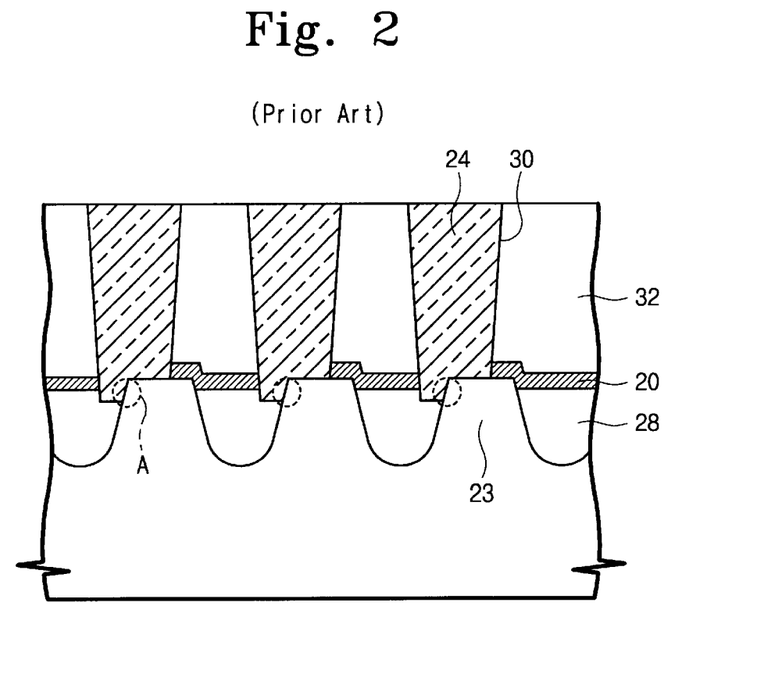
FIG. 2 is a cross-sectional view of a prior art nonvolatile memory device contact structure with field regions.

Furthermore, as shown in FIG. 2, with the prior art, especially when a borderless contact hole 30 that exposes both an active region 23 and the field region 28 through an interlevel dielectric layer 32 is formed, over-etching of the field region 28 can occur as indicated in the region designated as A, causing leakage current.

Accordingly, to overcome the above-mentioned problems and to improve the device characteristics such as charge-retention or endurance characteristics while reducing over-etching of the field region, there is an urgent need for improved sidewall spacer structures.

SUMMARY OF THE INVENTION

The present invention provides a nonvolatile memory device having high reliability with novel sidewall spacer structures. The gate stack structure for use in a nonvolatile memory device comprises a semiconductor substrate, a gate stack formed on the semiconductor substrate. The gate stack has a sidewall and a top surface. A muti-layer sidewall spacer structure is formed on the sidewall of the gate stack. The multi-layer sidewall spacer structure includes a first oxide layer, a first nitride layer, a second oxide layer, and a second nitride layer that are sequentially stacked. Thus, even if the second nitride layer is perforated or damaged during the formation of contact holes, sidewalls of the gate stack or nonvolatile memory cell can be protected with the first nitride layer from mobile ions invading from contact holes or surrounding structures. Also, etching damage to source/drain regions or field regions can be reduced. As a result, the device characteristics such as the charge retention and reliability of a memory cell can be significantly improved.

The foregoing and other objects, features and advantages of the invention will become more readily apparent from the following detailed description of a preferred embodiment of the invention that proceeds with reference to the accompanying drawings.

DETAILED DESCRIPTION

The present invention relates, in general, to a novel nonvolatile memory device structure having a gate stack formed over a semiconductor substrate. According to one aspect of the present invention, a multi-layer sidewall spacer structure is formed on the sidewall of the gate stack. Here, the multi-layer sidewall spacer structure includes a first oxide layer, a first nitride layer, a second oxide layer, and a second nitride layer that are sequentially stacked. Thus, even if the second nitride layer is perforated or damaged during the formation of contact holes, sidewalls of the gate stack of the nonvolatile memory cell can be protected with the first nitride layer from mobile ions invading from contact holes or surrounding structures. Also, in accordance with the present invention, etching damage to source/drain regions or field regions (field loss) can be reduced with the present invention, as explained further below.

These and other features and advantages of the present invention will be more clearly understood from the following detailed description taken in conjunction with the accompanying drawings. It is important to point out that the illustrations are not necessarily drawn to scale, and that there may be other embodiments of the present invention which are not specifically illustrated. In the following description, numerous specific details are set forth to provide a through understanding of the present invention. However, one having ordinary skill in the art should recognize that the invention can be practiced without these specific details. In some instances, well-known process steps, device structures, and techniques have not been shown in detail to avoid obscuring the present invention.

Figure 3A:
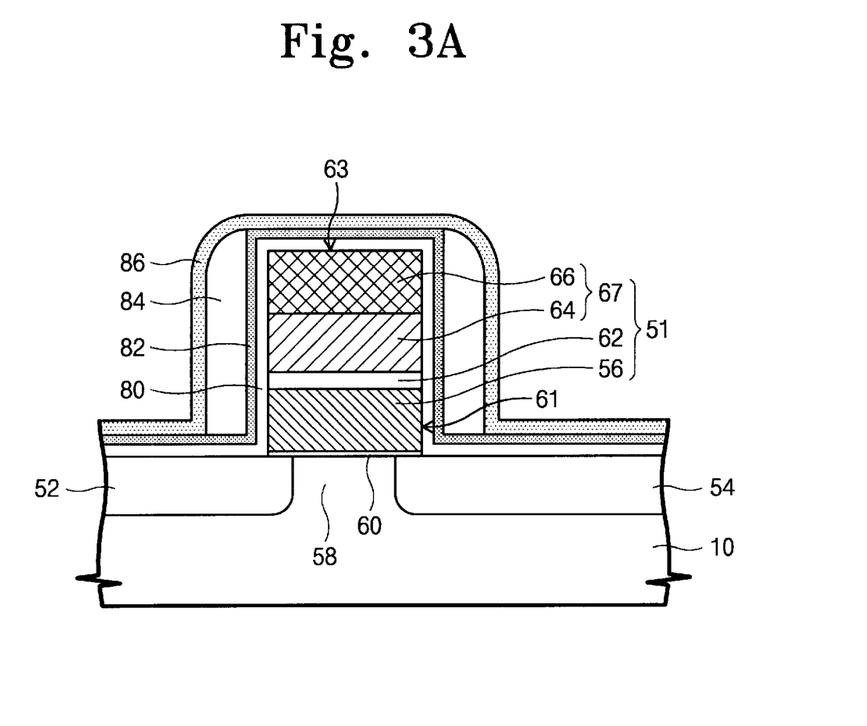
FIG. 3A is a cross-sectional view of a nonvolatile memory device cell structure according to one embodiment of the present invention.
Figure 3B:
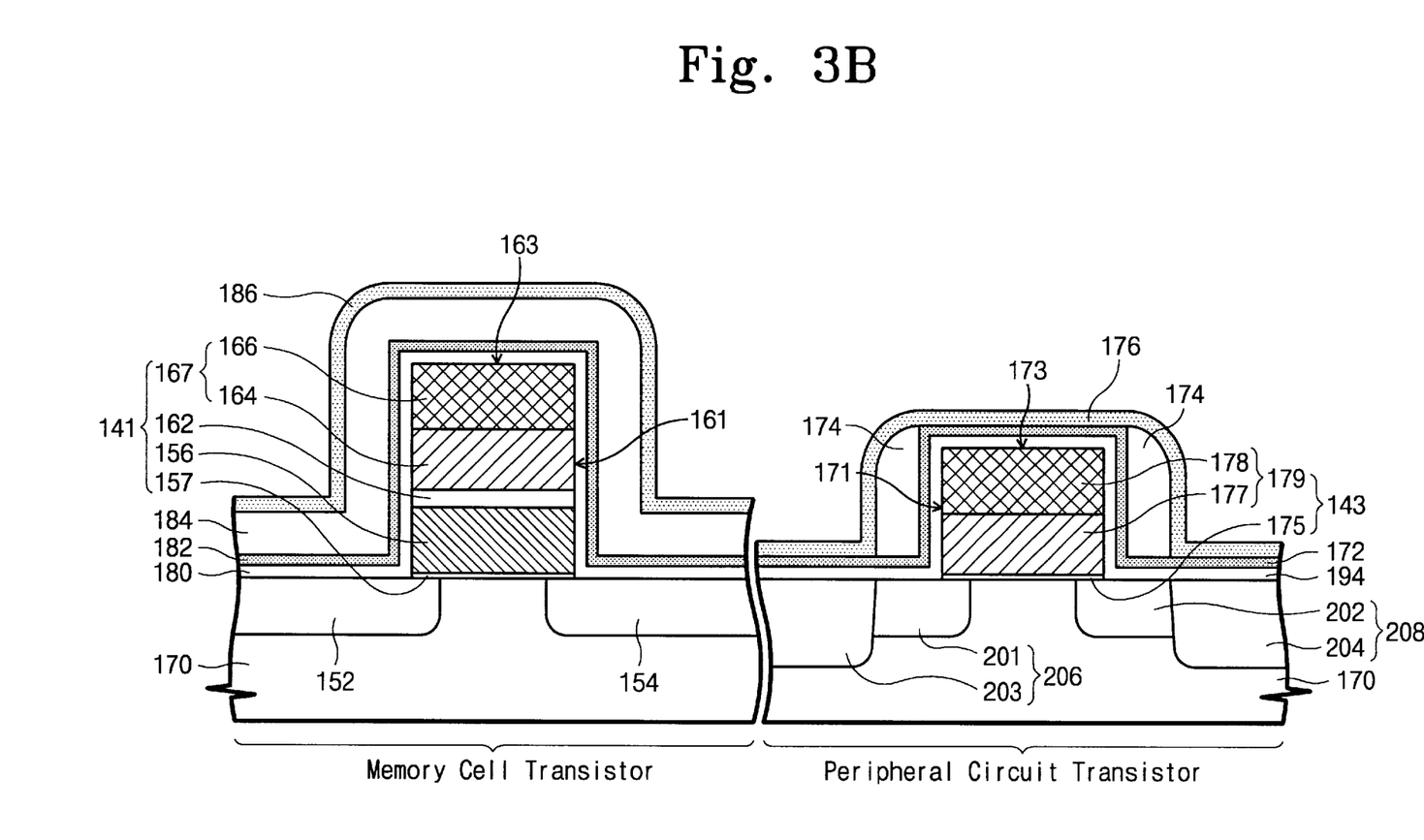
FIG. 3B is a cross-sectional view of a nonvolatile memory device having different sidewall spacer structures for each of a cell array region and a peripheral region.

The preferred embodiments of the present invention are best understood by referring to FIGS. 3A–3C of the drawings, like numerals are used for like and corresponding features of the various drawings.

Referring to FIG. 3A, a nonvolatile memory cell 49, in accordance with the preferred embodiment of the present invention, is formed on a semiconductor substrate 70.

As is known in the art, a gate stack 51 having a sidewall 61 and a top surface 63 is formed on the semiconductor substrate 70. A floating gate 56 is formed between source/drain regions 52, 54 and is insulated from a channel region 58 by a tunnel oxide film 60. The floating gate 56 is typically formed of a polysilicon layer. Other dielectric films other than oxide can be used as the tunnel oxide film 60. An intergate dielectric layer 62 formed of a material such as oxide-nitride-oxide (ONO) overlies the floating gate 56 as illustrated. Then, a control gate 67 is formed on the intergate dielectric layer 62. The control gate 67 is typically formed of polysilicon and can include a suicide layer 66 on its top. The source and drain regions 52, 54 are formed on opposite sides of the gate stack 51 within the semiconductor substrate 70.

The gate stack 51 of the nonvolatile memory cell 49 of the present invention can be composed of a silicon-oxide-nitride-oxide-semiconductor (SONOS) structure. The SONOS structure may have the typical configuration of an insulated gate field effect transistor, including a gate separated from a semiconductor substrate by a dielectric layer. Such a dielectric layer can include a layer of nitride, e.g., silicon nitride, sandwiched between layers of oxide, e.g., silicon dioxide. A person skilled in the art will appreciate that the SONOS structure incorporated in the present invention is not necessarily limited to one having a polysilicon gate. Such structure may also include gates formed from a metal and/or silicide and/or various combinations thereof. Further, a dielectric layer may include a tunnel dielectric other than oxide and a charge storage dielectric layer other than nitride.

In accordance with one embodiment of the present invention, a first oxide layer 80 is formed on the gate stack 51. The first oxide layer 80 covers the sidewall 61 of the gate stack 51. The first oxide layer 80 is formed of conventional materials such as silicon dioxide and absorbs stresses occurring between a nitride layer to be formed thereon and the semiconductor substrate 70, or the nitride layer to be formed thereon and the floating gate 56, as a stress buffer layer. Preferably, the first oxide layer 80 has a thickness of approximately 5–30 nm.

A first nitride layer 82 is formed on the first oxide layer 80. Preferably, the first nitride layer 82 has a thickness of approximately 5–30 nm. The first nitride layer 82 covers the sidewall 61 and the top surfaces 63 of the gate stack 51. The first nitride layer 82 can prevent the memory cell from invasion of mobile ions such as Na+, carbon, and $H_2O$ even if a second nitride layer 86 to be formed is perforated or damaged during subsequent contact opening steps via an etching process.

A second oxide layer 84 is formed on the first nitride layer 82. Preferably, the second oxide layer 84 has a thickness of greater than approximately 30 nm. The second oxide layer 84 covers the sidewall 61 of the gate stack 51 as a sidewall spacer. This second oxide layer 84 is understood to improve endurance characteristics and charge retention characteristics of a memory cell transistor compared to a spacer formed only of silicon nitride.

According to one embodiment, the second oxide layer 84 can be an etched-back sidewall spacer, as shown in FIG. 3A. To form the etched-back sidewall spacer, a sidewall spacer material layer for forming the second oxide layer is formed on the gate stack 51 and subsequently etched-back by conventional anisotropic etching techniques such as reactive ion etching (RIE). With the conventional structure such as shown in U.S. Pat. No. 5,453,634, field loss could easily occur because there is little etch selectivity between the sidewall spacer material layer formed of oxide and the field oxide. But, with the preferred embodiment of the present invention, the first nitride layer 82, as an etching stopping layer, prevents the semiconductor substrate 70 including an active region and a field region from pitting during the formation of the etched-back second oxide layer 84. Thus, device characteristics such as junction leakage characteristics can be improved with the embodiment of the present invention.

Alternatively, the second silicon oxide layer 84 may not be an etched-back sidewall spacer, but may instead be a layer formed conformally over the gate stack 51. That is, the second oxide layer 84 can be a conformal spacer layer overlies both the top surface 63 and the sidewall 61 of the gate stack 51 (See FIG. 3B).

Next, a second nitride layer 86 is formed over the resulting structure including the second oxide layer 84. The second nitride layer 86 has a thickness of greater than approximately 10 nm. Also, the second nitride layer 86 covers the sidewall 61 of the gate stack 51.

Here, the first and second oxide layers 80, 84 are formed of silicon dioxide, but other suitable insulation material can be used, instead. Because the first and second oxide layers are used as part of a sidewall structure, charge retention or endurance characteristics can be improved compared to the other conventional structures such described in U.S. Pat. No. 6,001,687, in which there are direct contacts between the polysilicon gates and the silicon nitride spacers, thus deteriorating charge retention or endurance characteristics. And the first and second nitride layers 82, 86 are preferably formed of silicon nitride, but other suitable nitride material can be used within the spirit and scope of the present invention.

Now referring to FIG. 3B, according to another embodiment, a nonvolatile memory device of the present invention may be seen to include a conformal sidewall spacer layer 184 for a memory cell transistor, but includes an etched-back sidewall spacer 174 for a peripheral circuit transistor. In particular, the nonvolatile memory device includes a memory cell transistor and a peripheral circuit transistor on a semiconductor substrate 170. The cell array transistor includes a first gate stack 141 and the peripheral circuit transistor includes a second gate stack 143. The first gate stack 141 includes a gate dielectric layer 157, a floating gate 156 on the gate dielectric layer 157, an intergate dielectric layer 162 on the floating gate 156, and a control gate 167 formed of a polysilicon layer 161 and a suicide layer 166 theron, on the intergate dielectric layer 162 for forming a nonvolatile memory cell transistor, as is known in the art. Alternatively, the first gate stack 141 can have a SONOS structure as described. The second gate stack 143 comprises a gate dielectric 175, and a gate electrode 179 on the gate dielectric 175 to form a peripheral circuit transistor. The gate electrode 179 typically comprises a polysilicon layer 177 and a silicide layer 178 formed on top of the polysilicon layer 177.

The first and second gate stacks 141, 143 each has a sidewall 161, 171, respectively, and a top surface 163, 173, respectively. A first oxide layer 180 is formed on the first gate stack 141 as in the same manner for forming the first oxide layer 80 of FIG. 3A. The first oxide layer 180 covers the sidewall 161 of the first gate stack 141. A first nitride layer 182 is formed on the first oxide layer 180. The first nitride layer 182 covers the sidewall 161 of the first gate stack 141. A second oxide layer 184 is formed on the first nitride layer 182. Here, the second oxide layer 184, without being etched-back, conformally overlies the top surface 163 of the first gate stack 141 and covers the sidewall 161 of the first gate stack 141. A second nitride layer 186 is formed on the second oxide layer 184 and the second nitride layer 186 covers the sidewall 161 of the first gate stack 141.

On the other hand, with respect to the second gate stack 143 for the peripheral circuit transistor, a first oxide layer 194 is formed on the second gate stack 143. A first nitride layer 172 is formed on the first oxide layer 194. The first nitride layer 172 covers the sidewall 171 and the top surface 173 of the second gate stack 143. An etched-back oxide sidewall spacer 174 is formed on the first nitride layer 172. The etched-back oxide sidewall spacer 174 covers the sidewall 171 and the top surface 173 of the second gate stack 143. A second nitride layer 176 is formed on the resulting structure including the etched-back oxide sidewall spacer 174. The second nitride layer 176 covers the sidewall 171 of the second gate stack 143.

With this embodiment, the cell array region needs not be subjected to etching steps that might cause etching damage to the substrate 170 in the cell array region, as will explained further below.

The present invention is not, however, limited to the structure shown in FIG. 3B and various combinations of sidewall spacer structures can be used within the spirit and scope of the present invention. For example, according to another embodiment, a nonvolatile memory device of the present invention may be seen to include an etched-back sidewall spacer for both a memory cell transistor and a peripheral circuit transistor.

According to one embodiment, source/drain regions 152, 154 are formed in the substrate on opposite sides of the first gate stack 141 for forming a nonvolatile memory cell. The source/drain regions 152, 154 may have a non-gradual abrupt junction structure, i.e., a single highly-doped impurity region, or a double diffused junction structure, shielding the highly-doped impurity region with a lightly-doped impurity region. Source/drain regions 165, 167 of the peripheral circuit transistor has lightly-doped source/drain (LDD) structures. A top plan view of nonvolatile memory cells according to one embodiment of the present invention is illustrated in the FIG. 4A. The nonvolatile memory cells, e.g., NOR type nonvolitile memory cells, are arranged in a matrix in a row direction and a column direction.

Figure 4A:
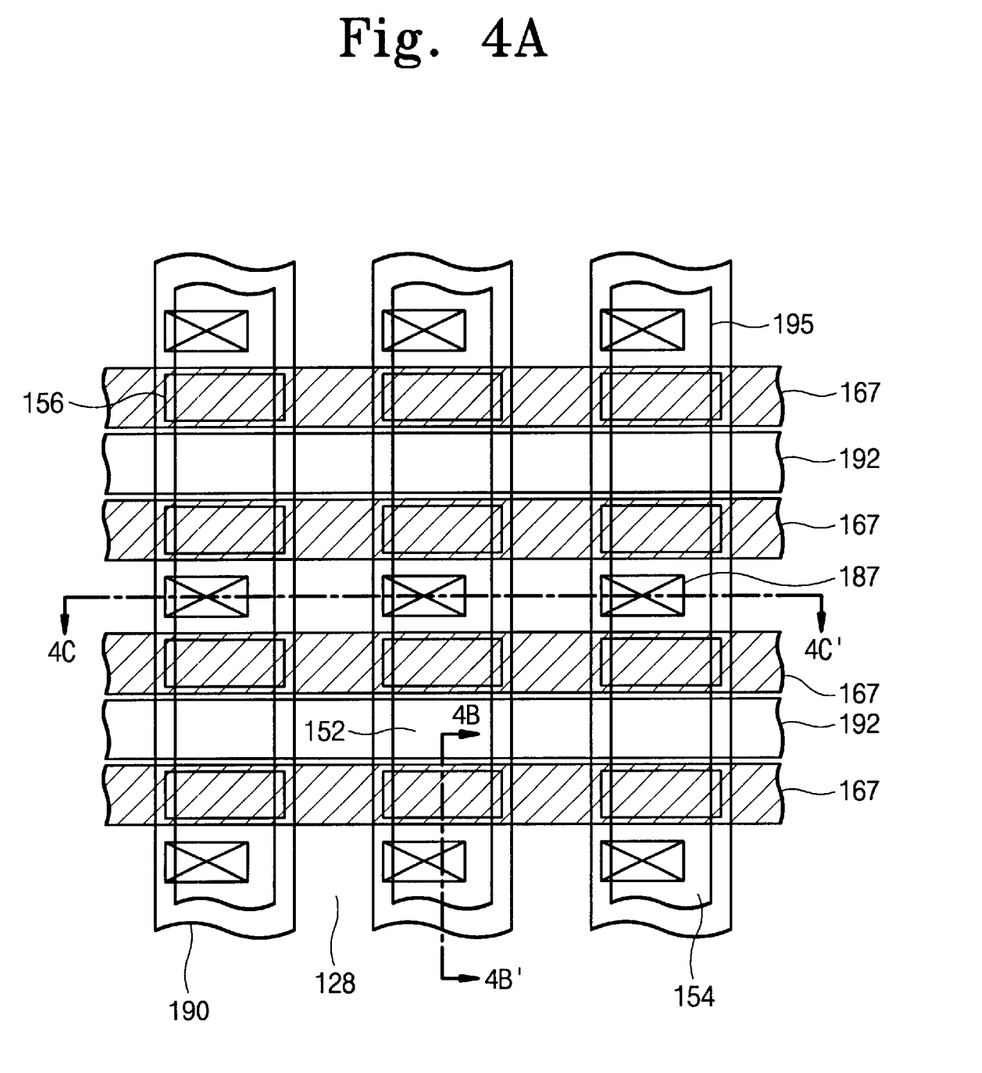
FIG. 4A is a plan view of nonvolatile memory cells in accordance with one embodiment of the invention.
Figure 4B:
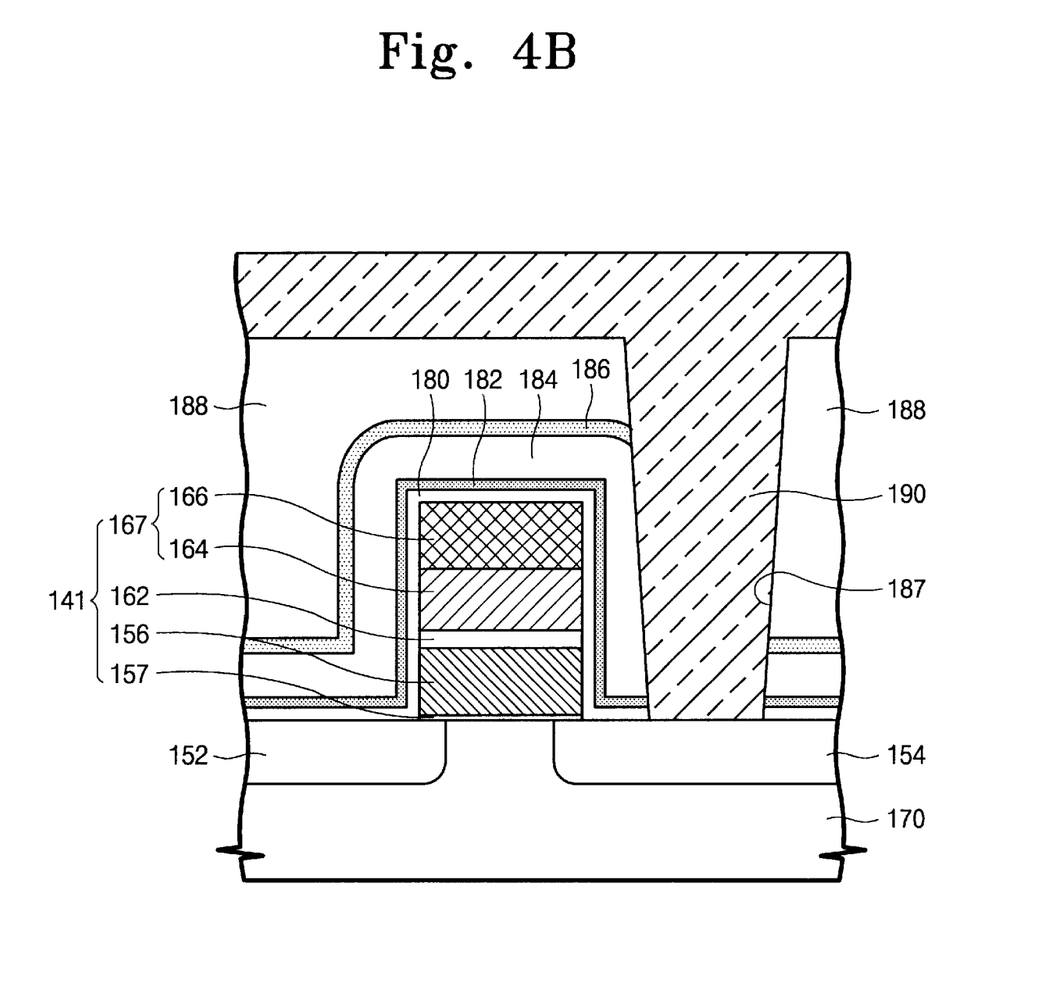
FIG. 4B is a cross-sectional view taken along line 4B–4B' in accordance with one embodiment of the invention to illustrate the benefit thereof.

Word lines 167 are arranged in parallel in a row direction and bit lines 190 are arranged in parallel in a column direction. Active regions 195 are defined by field regions 128 formed of oxide and disposed in parallel to the direction of the bit lines 190. Each of the nonvolatile memory cells is formed in the active region. The bit lines 190 are connected via contact hole 187 to drain regions 154 of the memory cells. Source lines 192 connecting source regions 152 of the memory cells are formed in parallel to the word lines 167. FIG. 4B is a cross sectional view taken along line 4B–4B' in FIG. 4A. Now referring to FIG. 4A and FIG. 4B, an interlevel dielectric layer 188 is formed over the resulting structure including the gate stack 141. The interlevel dielectric layer 188 is formed of a material such as boroposphosilicate glass (BPSG) or undoped silicate glass (USG). The contact hole 187 is formed in the interlevel dielectric layer 188. A conductive layer, e.g., the bit line 190 is formed within the contact hole 187 in the interlevel dielectric layer 188 electrically connected to the drain region 154. During this process, due to ever decreasing spacing between gate lines as discussed above, the second nitride layer 186 can be easily damaged or perforated with the conventional structures as illustrated in FIG. 1, degrading device characteristics as explained above. However, according to the novel aspects of the present invention as illustrated in FIG. 4, because the first nitride layer 182 can prevent the memory cell from invasion by mobile ions such as Na+, carbon, and $H_2O$ even if a second nitride layer 186 is perforated or damaged during such etching steps for contact opening, substantially all of the electrons trapped in the floating gate 156 do not become neutralized by ingress of charged atoms from surrounding structures such as the contact hole 187, during programming. Accordingly, one of the problems of the conventional techniques can be overcome and the etching margin can be substantially increased. As a result, the device characteristics such as charge-retention or endurance characteristics can be significantly increased.

Figure 4C:
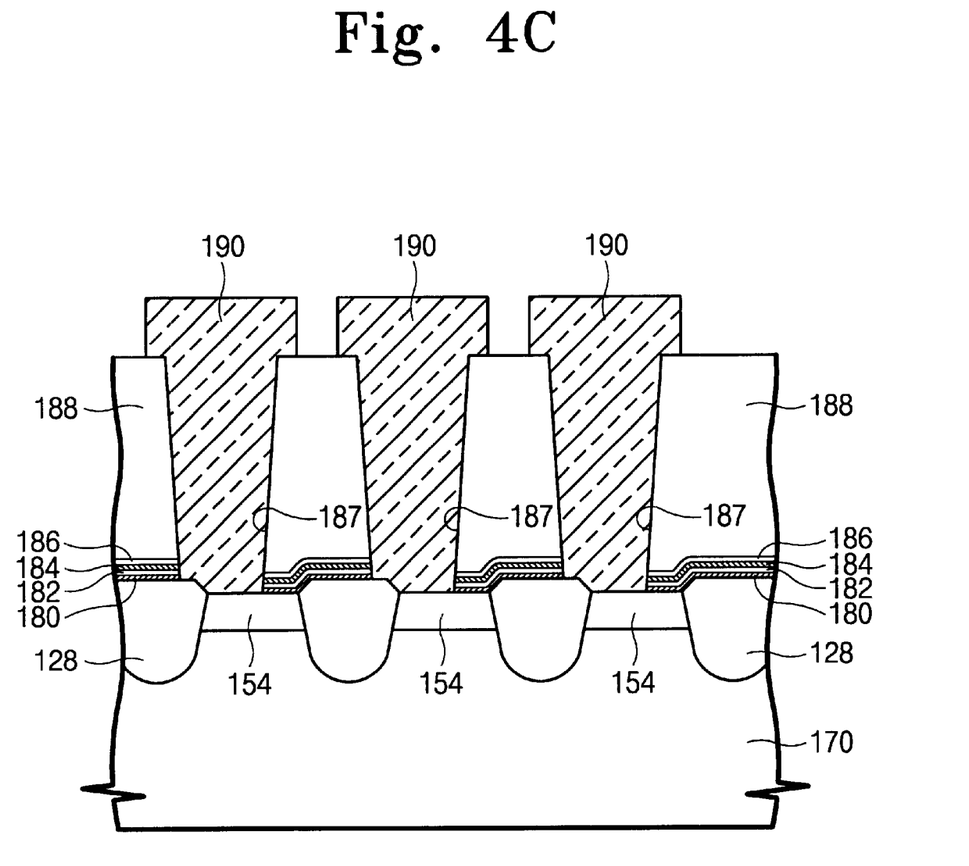
FIG. 4C is a cross-sectional view taken along line 4C–4C' in accordance with one embodiment of the present invention.

FIG. 4C is a cross-sectional view taken along line 4C–4C' in FIG. 4A. Now referring to FIG.4A and FIG.4C, the first nitride layer 182, the second oxide layer 184, and second nitride layer 186 are sequentially formed on a region of field regions 128 and a region of the source/drain regions 152, 154. That is, the first and second nitride layers 182, 186 contact each other on a region of the field region 128 and on a region of the source/drain regions 152, 154. With the present invention, because the first oxide layer 180 is formed below the first nitride layer 182, the direct contact between the first nitride layer 182 and the semiconductor substrate 170 including source/drain regions 152, 154 can be avoided, thus reducing the tensile stress therebetween, which deteriorates the device characteristics.

As shown in FIGS. 4B and 4C, the interlevel dielectric layer 188 is formed over the gate stack 141, and also over the field region 128. According to one embodiment, the contact holes 187 formed in the interlevel dielectric layer 188 are borderless contacts therein electrically connected to the drain region 154. Here, the first and second nitride layers 182, 186, as an etch stopper layer, prevent the field regions 128 from etching damage during the formation of contact holes 187 for forming the borderless contacts. In other words, the pitting of the drain region, 154 or the damage to the field regions 128 can be effectively reduced as schematically illustrated in FIG. 4C. This is because the first nitride layer 182 supplements the second nitride layer 186 for protecting the drain region 154 or the field regions 128 from being damaged during various processing steps such as one during the formation of borderless contact holes on the drain region, 154, while preventing the memory cell from invasion of mobile ions such as Na+, carbon, and $H_2O$ even if a second nitride layer 186 is perforated or damaged during such contact opening steps.

This is contrasted with conventional structures, where there is only a single nitride layer over source/drain regions or field regions, the single layer being insufficient to reduce the etching damage to the field region or the drain region as in the present invention, and being unable to prevent the memory cell from invasion of mobile ions.

Thus, with the present invention, junction leakage characteristics can be improved and the shallow junction can be better achieved without the problems of the prior art, allowing further scaling of the nonvolatile memory device.

FIGS. 5A–5F illustrate a method for manufacturing a nonvolatile memory device incorporating different sidewall spacer structures for each cell array region and a peripheral circuit region, each in accordance with one embodiment of the present invention. Details of the manufacturing steps are omitted if they are conventional or well known, for clarity and simplicity.

Figure 5A:
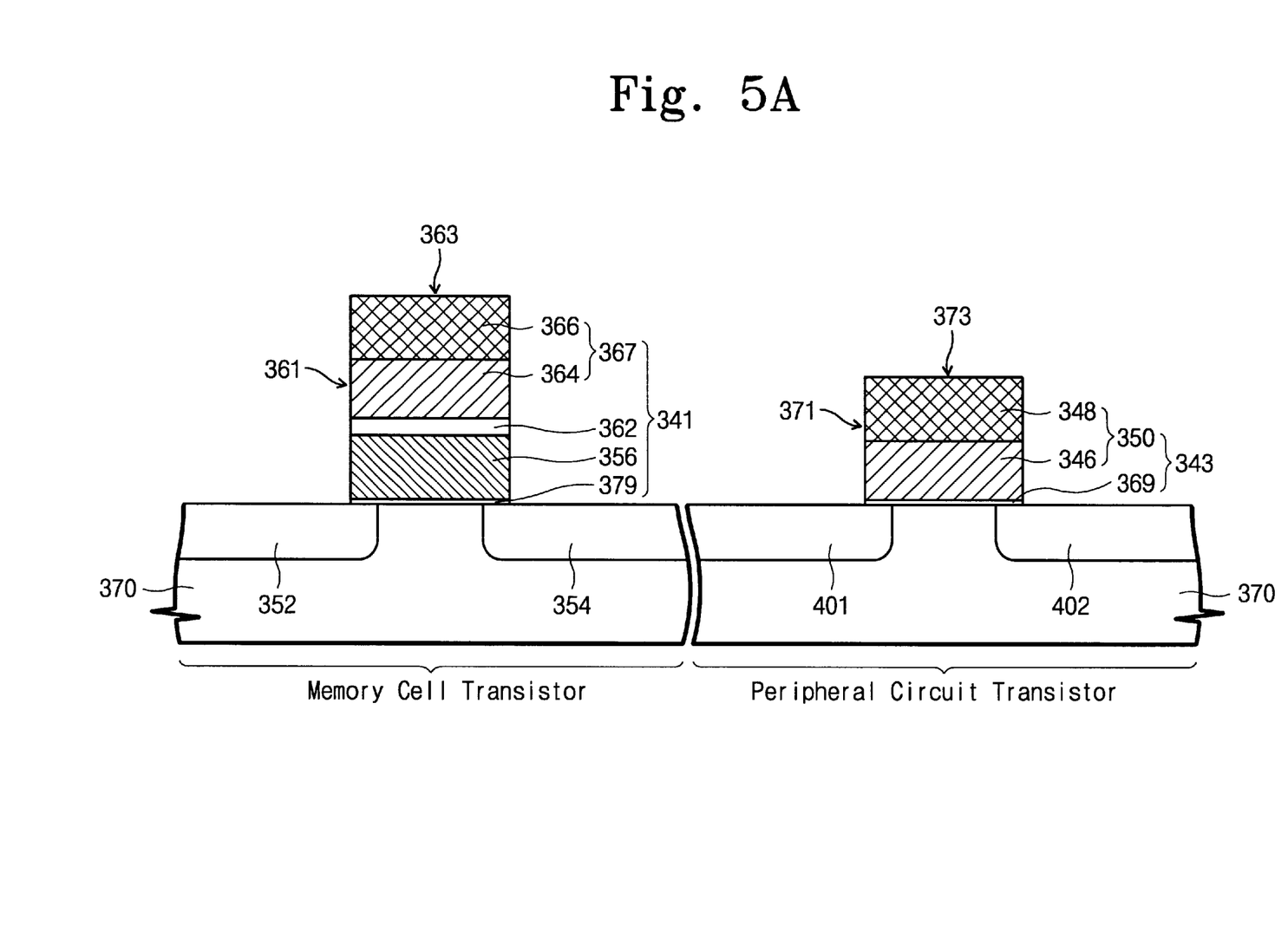
FIGS. 5A–5F illustrate a method for manufacturing a nonvolatile memory device incorporating sidewall spacer structure in accordance with one embodiment of the present invention.

According to one embodiment, as shown in FIG. 5A, a memory cell array transistor and a peripheral circuit transistor are defined on a semiconductor substrate 370. A first gate stack 341 for forming a nonvolatile memory cell is formed in the memory cell array region. The first gate stack 341 comprises a gate dielectric 379, a floating gate 356 on the gate dielectric layer 379, an intergate dielectric layer 362 on the floating gate 356, and a control gate 367 on the intergate dielectric layer 362 to form a nonvolatile memory cell. Also, a second gate stack 343 is formed in the peripheral circuit region. The second gate stack 343 comprises a gate dielectric layer 369, and a gate electrode 350 on the gate dielectric layer 369 to form a peripheral circuit transistor. The first and second gate stacks 341, 343 have sidewalls 361, 371, respectively, and top surfaces 363, 373, respectively. Highly-doped impurity regions for source/drain regions 352, 354 are formed adjacent the first gate stack 341 of the memory cell in the semiconductor substrate 370, and lightly-doped impurity regions (LDD regions) 401, 402 for source/drain regions of the peripheral circuit transistor are formed adjacent the second gate stack 343 of the peripheral circuit transistor in the semiconductor substrate, as is known in the art.

Figure 5B:
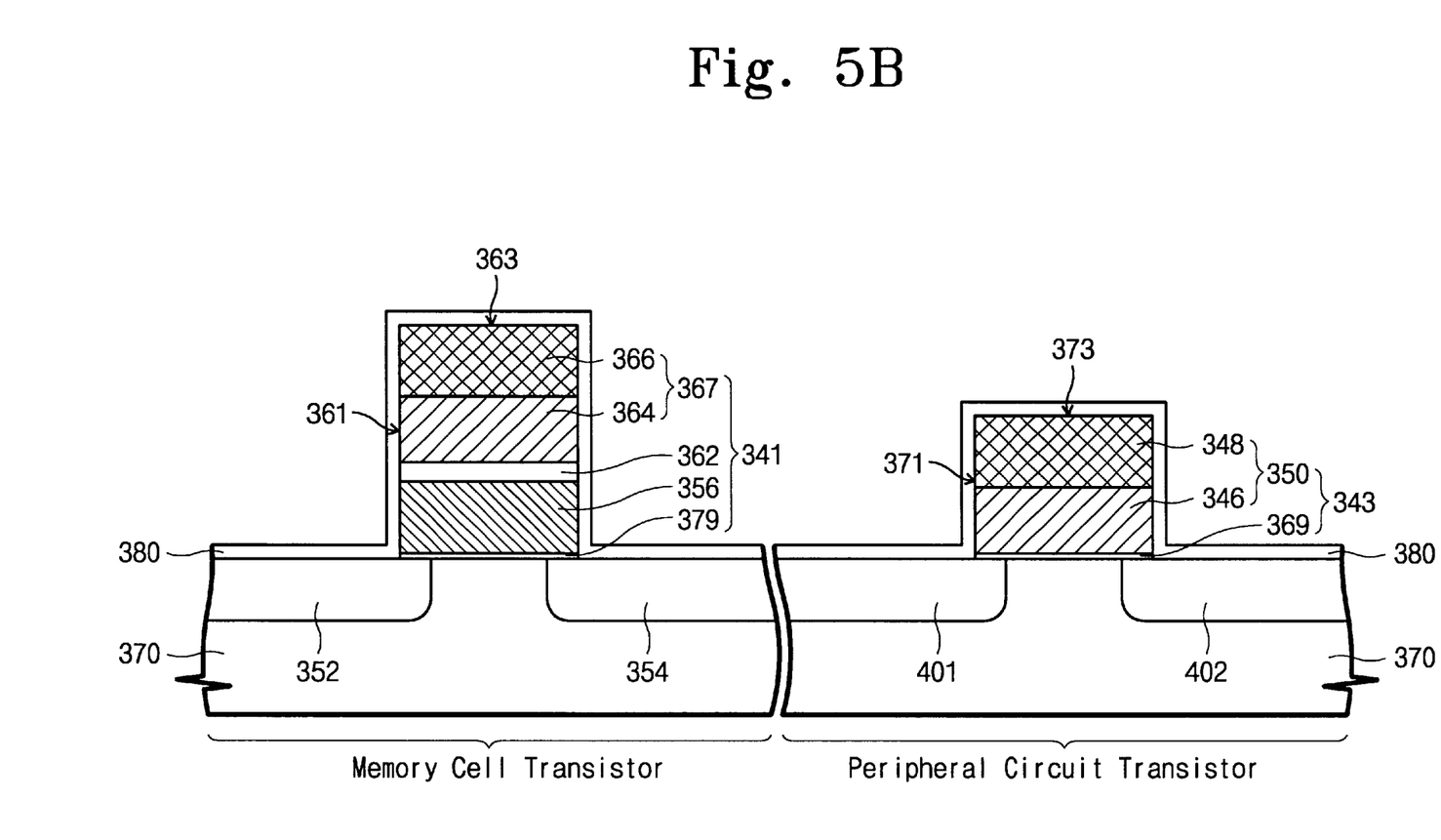

Turning to FIG. 5B, a first oxide layer 380 is formed on the first and second gate stacks 341, 343, covering the top surfaces 363, 373 and the sidewalls 361, 371 of the first and second gate stacks 341, 343, respectively.

Figure 5C:
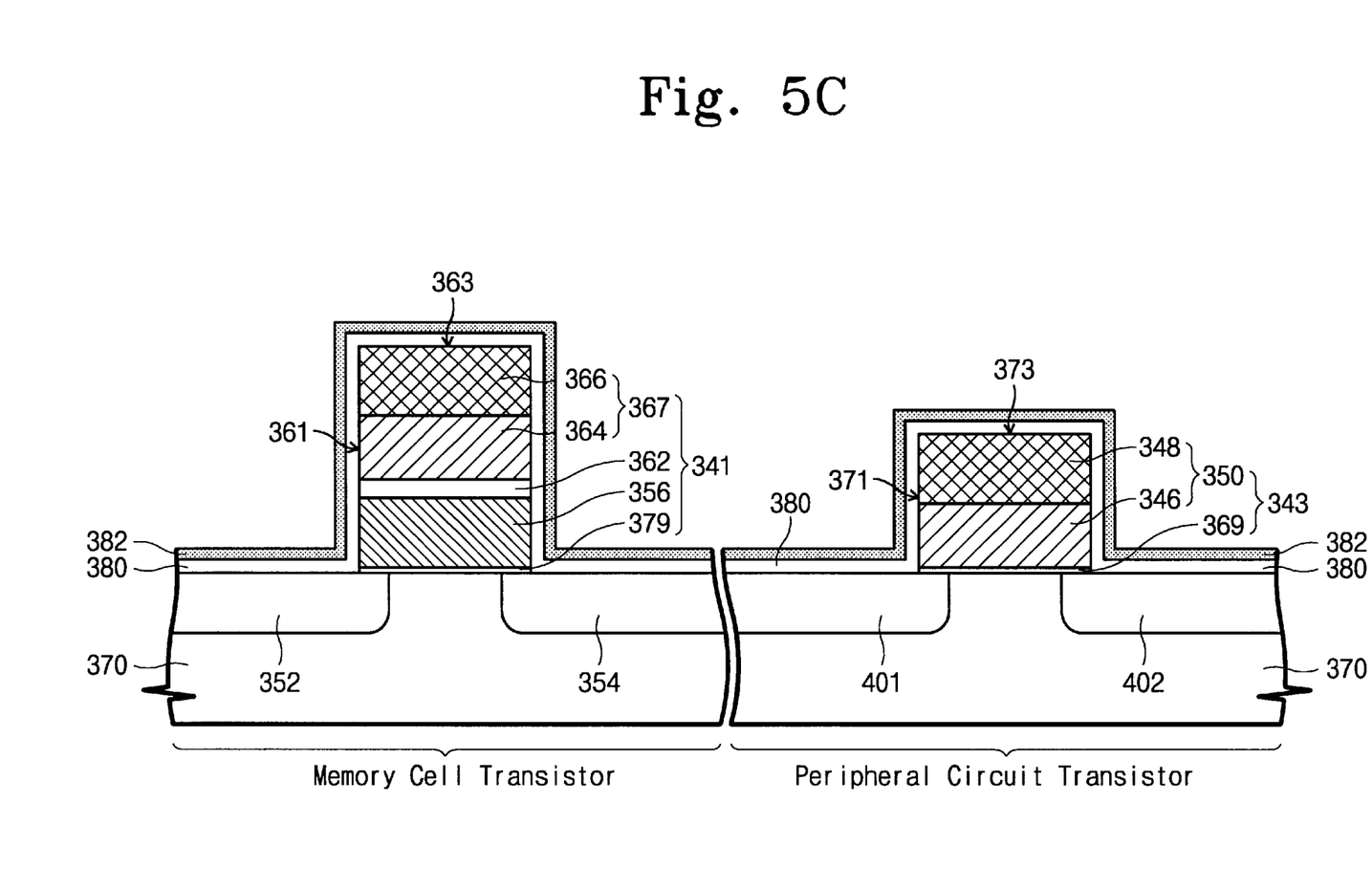

Referring to FIG. 5C, a first nitride layer 382 is formed on the first oxide layer 380 using conventional techniques.

Figure 5D:
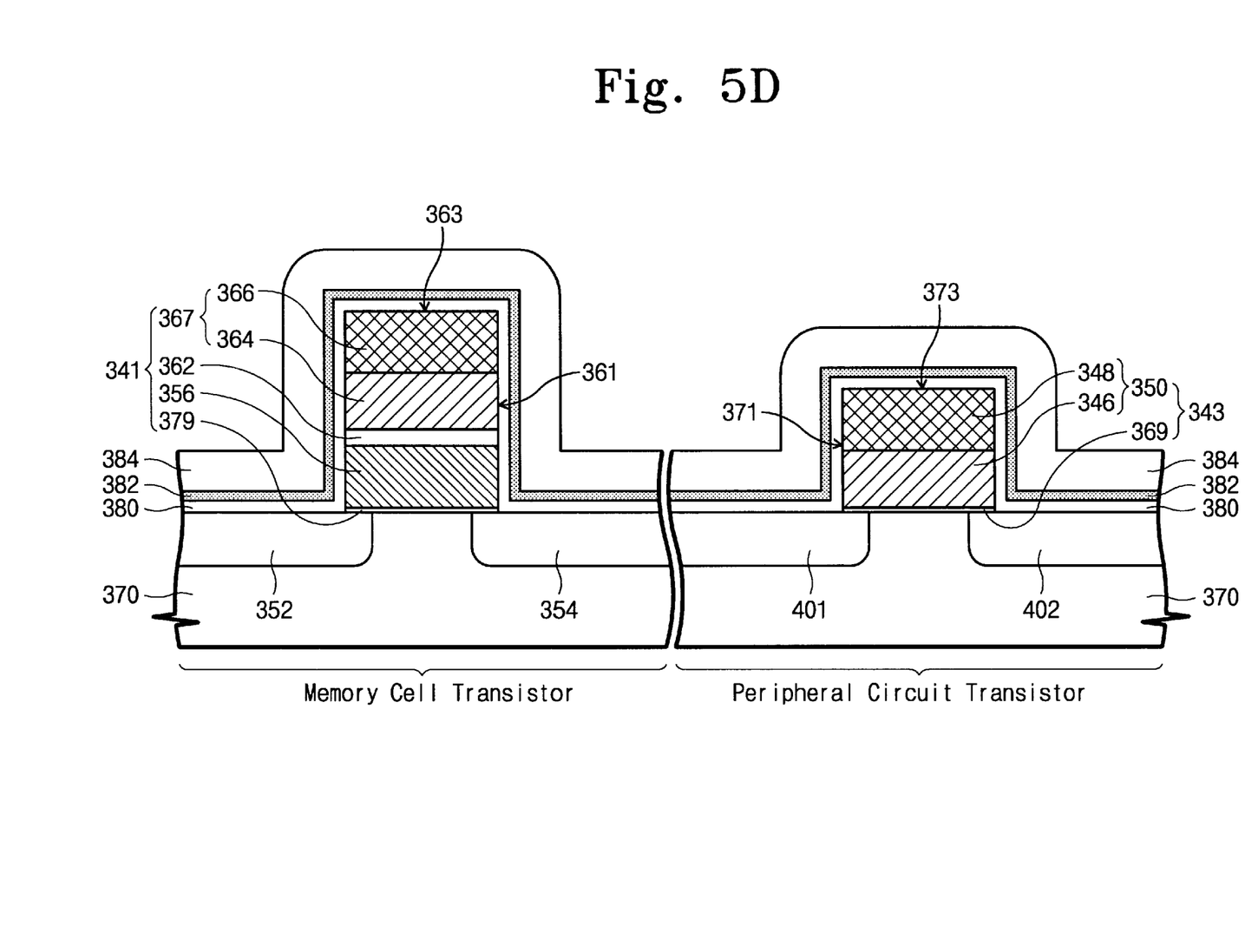

As shown in FIG. 5D, a second oxide layer 384 is formed on the first nitride layer 382.

Figure 5E:
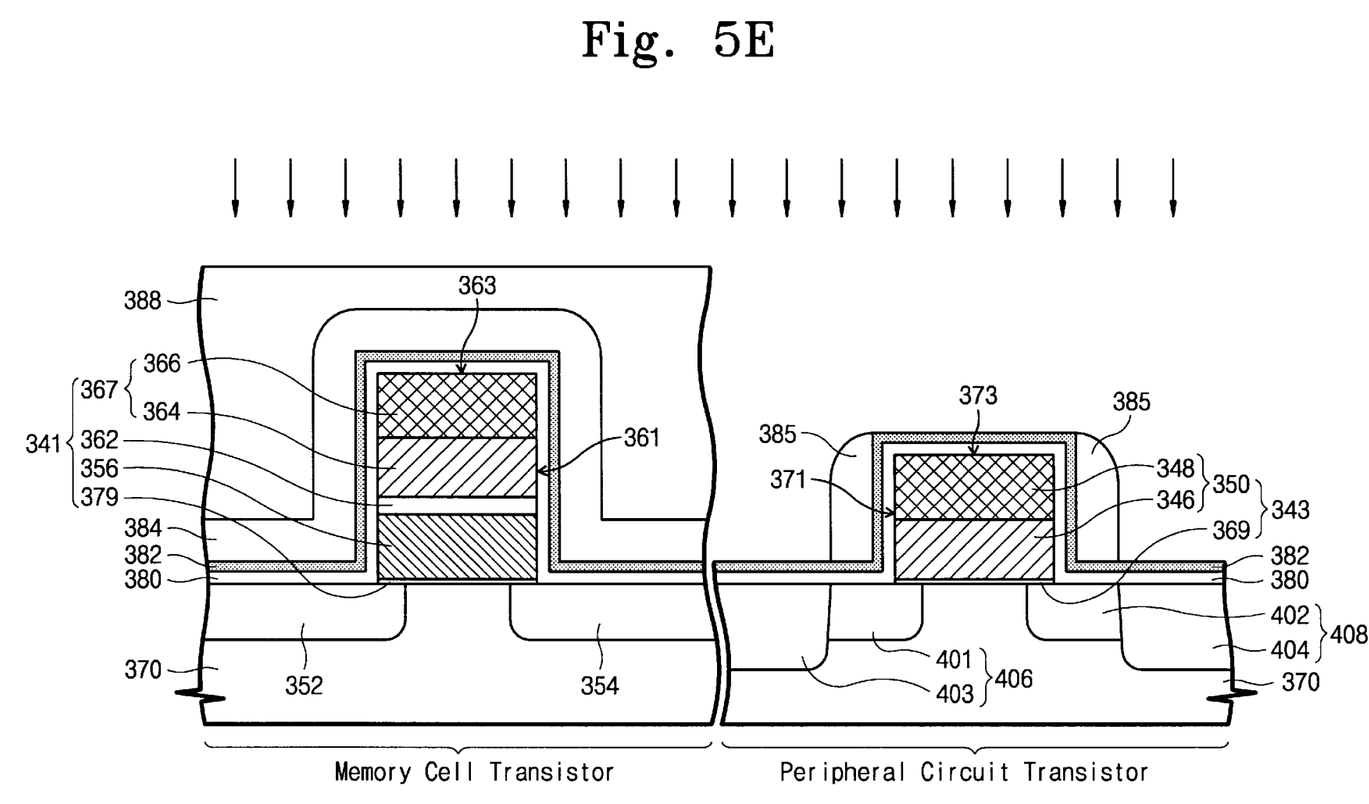

Turning to FIG. 5E, subsequently, according to one embodiment, the second oxide layer 384 in the peripheral circuit region is selectively etched-back to form an etched-back sidewall spacer 385 over the sidewall 371 of the second gate stack 343, leaving the second oxide layer 384 not etched back in the cell array region by covering the cell array region with a mask 388. This feature of the present invention is advantageous for manufacturing nonvolatile memory devices for several reasons. For example, overetching damage to the semiconductor substrate 370 in the peripheral circuit region can be prevented. In the prior art, when sidewall spacer etching is performed on both the cell array region and the peripheral circuit region, damage to the semiconductor substrate 370 in the peripheral circuit region can occur due to the step difference between the memory cell and the peripheral circuit transistor gate of which height is lower than that of the memory cell.

Then, impurities (indicated by a series of down arrows) are introduced with high doping concentration in the semiconductor substrate using a mask layer 388 to form highly-doped impurity regions 403, 404 for source/drain regions 406, 408 of the peripheral circuit transistor, to thereby form LDD structures therein.

Figure 5F:
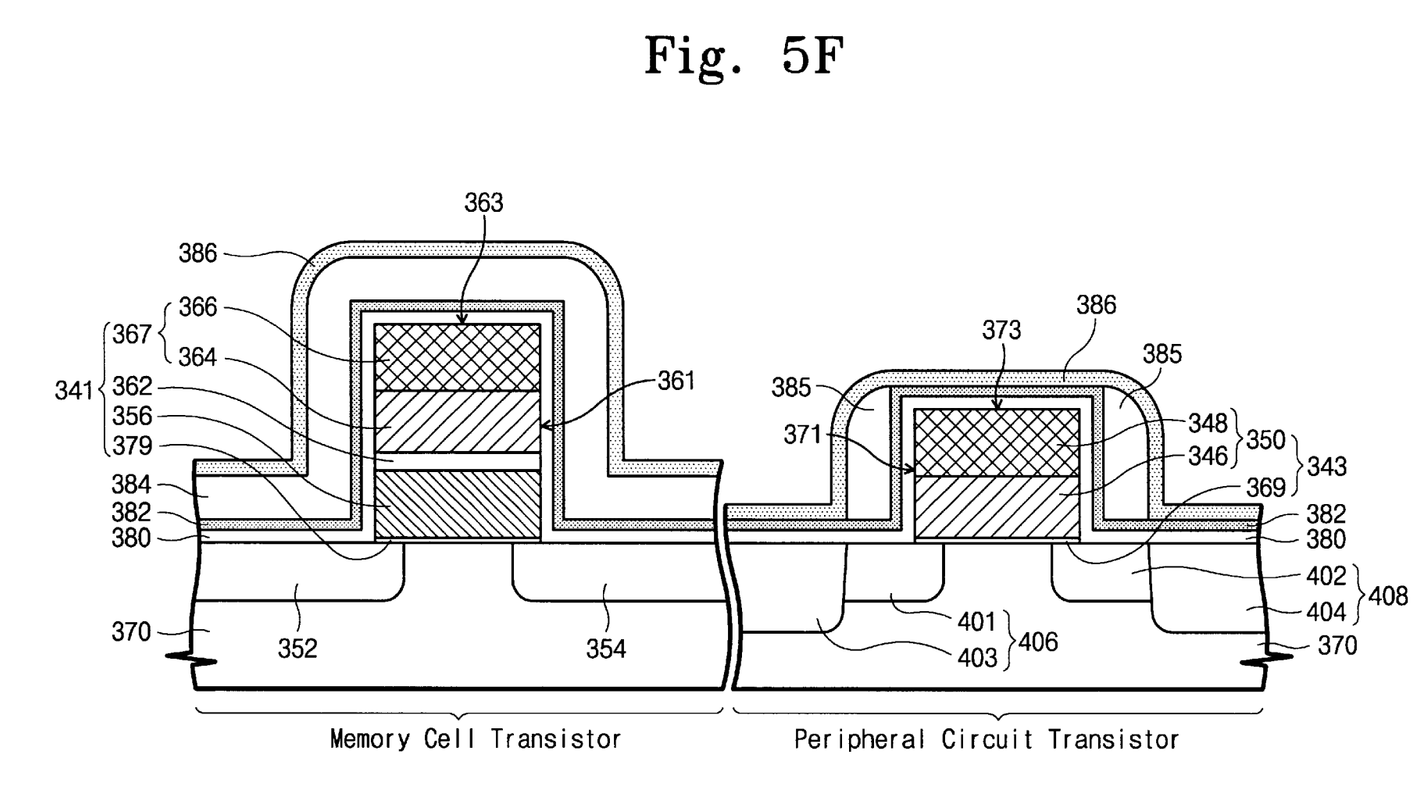

Now turning to FIG. 5F, a second nitride layer 386 is formed on the resulting structure. Although not shown, an interlevel dielectric (ILD) layer such as boroposphosilicate glass (BPSG), or undoped silicate glass (USG) is deposited on the resulting structure. Contact holes are formed in the ILD layer to expose the source or drain region of memory cell transistor and peripheral circuit transistor. The first and second silicon nitride layers 382, 386 are used as an etching stopper to prevent the source/drain regions of memory cell transistor and peripheral circuit transistor from damages during etching of the ILD layer. A conductive layer is then formed in the contact holes to form electrodes of the memory cell transistor and the peripheral circuit transistor.

In conclusion, with the present invention described above, even if the second nitride layer is perforated or damaged during the formation of contact holes, sidewalls of the gate stack of nonvolatile memory cell can be protected with the first nitride layer from mobile ions invading from contact holes or surrounding structures. Also, etching damage to source/drain regions or field regions can be reduced. As a result, the device characteristics such as the charge retention and reliability of a memory cell can be significantly improved.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A nonvolatile memory cell, comprising:
   a semiconductor substrate;
   a gate stack formed on the semiconductor substrate, the gate stack including a tunnel insulating layer, a floating gate, an intergate dielectric layer and a control gate and having a sidewall and a top surface; and
   a multi-layer sidewall spacer structure formed on the sidewall of both the floating gate and the control gate;
   wherein the multi-layer sidewall spacer structure including a first oxide layer, a first nitride layer, a second oxide layer, and a second nitride layer, which are sequentially stacked.

2. The gate stack structure of claim 1, wherein the second oxide layer comprises an etched-back sidewall spacer.

3. The gate structure of claim 1, wherein the second oxide layer comprises a conformal sidewall spacer that overlies the top surface of the gate stack.

4. A nonvolatile memory cell, comprising:
   a semiconductor substrate having a field region and an active region;
   a gate stack formed on the active region, the gate stack having a sidewall and a top surface, the gate stack comprising a tunnel insulating layer, a floating gate, an intergate dielectric layer and a control gate;
   a pair of source and drain regions formed on opposite sides of the gate stack within the active region;
   a first oxide layer formed on the gate stack, the first oxide layer covering the sidewall of both the floating gate and the control gate;
   a first nitride layer formed on the first oxide layer, the first nitride layer covering the sidewall of the gate stack;
   a second oxide layer formed on the first nitride layer, the second oxide layer covering the sidewall of the gate stack; and
   a second nitride layer formed on the second oxide layer, the second nitride layer covering the sidewall of the gate stack.

5. The nonvolatile memory cell of claim 4, wherein said first oxide layer has a thickness of approximately 5–30 nm.

6. The nonvolatile memory cell of claim 4, wherein said first nitride layer has a thickness of approximately 5–30 nm.

7. The nonvolatile memory cell of claim 4, wherein said second oxide layer has a thickness of greater than approximately 30 nm.

8. The nonvolatile memory cell of claim 4, wherein said second nitride layer has a thickness of greater than approximately 10 nm.

9. The nonvolatile memory cell of claim 4, wherein said second oxide layer comprises an etched-back sidewall spacer.

10. The nonvolatile memory cell of claim 9, wherein the first oxide layer is formed on a portion of the source and drain regions, and wherein the first and second nitride layers are formed sequentially on the first oxide layer on the source and drain regions.

11. The nonvolatile memory cell of claim 10, further comprising an interlevel dielectric layer overlying the gate stack, the interlevel dielectric layer having a borderless contact therein electrically connected to the drain region, wherein the first and second nitride layers are formed sequentially overlying a portion of the field region.

12. The nonvolatile memory cell of claim 4, wherein said second oxide layer conformally covers the top surface of the gate stack.

13. The nonvolatile memory cell of claim 4, wherein the first oxide layer is formed on the source and drain regions, and wherein the first nitride layer, the second oxide layer and the second nitride layer are sequentially formed on the first oxide layer on the source and drain regions.

14. The nonvolatile memory cell of claim 13, further comprising an interlevel dielectric layer formed over the gate stack, and a conductive layer formed in the interlevel dielectric layer electrically connected to the drain region.

15. The nonvolatile memory cell of claim 13, further comprising an interlevel dielectric layer overlying the gate stack, the interlevel dielectric layer having a borderless contact therein electrically connected to the drain region, wherein the first oxide layer, the first nitride layer, the second oxide layer, and second nitride layers are sequentially formed on a region of the field region.

16. A nonvolatile memory device including a cell transistor and a peripheral circuit transistor on a semiconductor substrate, the cell transistor including a first gate stack and the peripheral circuit transistor including a second gate stack, the first and second gate stacks each having a sidewall and a top surface,
wherein the first gate stack comprises:
   a gate dielectric layer, a floating gate on the gate dielectric layer, an integrate dielectric layer on the floating gate, and a control gate on the intergate dielectric layer to form a nonvolatile memory cell, and
wherein the second gate stack comprises:
   a gate dielectric layer, a gate electrode on the gate dielectric layer to form a peripheral circuit transistor,
   the first gate stack further comprising:
      a first oxide layer formed on the first gate stack, the first oxide layer covering the sidewall of the floating gate and the control gate of the first gate stack;
      a first nitride layer formed on the first oxide layer, the first nitride layer covering the sidewall of the first gate stack;
      a second oxide layer formed on the first nitride layer, the second oxide layer conformally overlying the top surface of the first gate stack and covering the sidewall of the first gate stack; and
      a second nitride layer formed on the second oxide layer, the second nitride layer covering the sidewall of the first gate stack,
   the second gate stack further comprising:
      a first oxide layer formed on the second gate stack;
      a first nitride layer formed on the first oxide layer, the first nitride layer covering the sidewall of the second gate stack;
      an etched-back oxide sidewall spacer formed on the first nitride layer, the etch-back oxide sidewall spacer covering the sidewall of the second gate stack; and
      a second nitride layer formed on the resulting structure including the etched-back oxide spacer, the second nitride layer covering the sidewall of the second gate stack.

17. A NOR-type nonvolatile memory cell, comprising:
   a semiconductor substrate;
   a gate stack formed on the semiconductor substrate, the gate stack including a tunnel insulating layer, a floating gate, an integrate dielectric layer, a control gate and having a sidewall and a top surface;
   a pair of source and drain regions on opposite sides of the gate stack, the drain region having an abrupt junction within the semiconductor substrate;
   a first oxide layer formed on the gate stack, the first oxide layer covering the sidewall of the gate stack;
   a first nitride layer formed on the first oxide layer, the first nitride layer covering the sidewall of the gate stack;
   a second oxide layer formed on the first nitride layer, the second oxide layer covering the sidewall of the gate stack; and
   a second nitride layer formed on the second oxide layer, the second nitride layer covering the sidewall of the gate stack.

18. A nonvolatile memory device including a cell transistor and a peripheral circuit transistor formed on a semiconductor substrate, the cell transistor including a first gate stack and the peripheral circuit transistor including a second gate stack, the first and second gate stacks each having a sidewall and a top surface, first source/drain regions formed adjacent the first gate stack and second source/drain regions formed adjacent the second gate stack, the nonvolatile memory device, comprising:

a first oxide layer formed on the first and second gate stacks, the first oxide layer covering the sidewall of the first and second gate stacks;

a first nitride layer formed on the first oxide layer, the first nitride layer covering the sidewall of the first and second gate stacks, a conformal oxide spacer layer covering the sidewall and the top surface of the first gate stack;

an etched-back oxide sidewall spacer formed on the first nitride layer, the etched-back oxide sidewall spacer covering the sidewall of the second gate stack; and a second nitride layer formed on the conformal oxide spacer layer and the etched-back oxide sidewall spacer, the second nitride layer covering the sidewall of the first and second gate stacks, wherein each of the first source/drain regions has a single highly-doped impurity region and each of the second source/drain regions has a LDD structure.

19. The nonvolatile memory device of claim 18, wherein the first source/drain regions includes a lightly-doped impurity region, shielding the single highly-doped impurity region.

20. A nonvolatile memory device comprising:

a semiconductor substrate;

a gate stack formed on the semiconductor substrate, the gate stack including a control gate, a dielectric layer, a charge-storage dielectric layer, and a gate dielectric layer, the gate stack having a sidewall and a top surface; and a multi-layer sidewall spacer structure formed on the sidewall of the gate stack, wherein the multi-layer sidewall spacer structure includes a first oxide layer, a first nitride layer, a second oxide layer, and a second nitride layer, which are sequentially stacked.

21. The device of claim 20, wherein the control gate is formed of silicon, and wherein the dielectric layer and the gate dielectric layer are formed of oxide and the charge-storage dielectric layer is formed of nitride to form a silicon-oxide-nitride-oxide-semiconductor (SONOS) structure.

22. The device of claim 20, wherein the second oxide layer comprises an etched-back sidewall spacer.

23. The device of claim 20, wherein the second oxide layer comprises a conformal sidewall spacer that overlies the top surface of the gate stack.

24. The device of claim 1, wherein the first nitride layer is directly formed on the first oxide layer, the second oxide layer is directly formed on the first nitride layer, and the second nitride layer is directly formed on the second oxide layer.

* * * * *

UNITED STATES PATENT AND TRADEMARK OFFICE
CERTIFICATE OF CORRECTION

PATENT NO. : 6,555,865 B2
DATED : April 29, 2003
INVENTOR(S) : Lee et al.

It is certified that error appears in the above-identified patent and that said Letters Patent is hereby corrected as shown below:

Column 3,
Line 48, "include a suicide layer" should read -- include a silicide layer --.

Column 5,
Line 17, "and a suicide" should read -- and a silicide --.

Signed and Sealed this

Thirteenth Day of December, 2005

JON W. DUDAS
*Director of the United States Patent and Trademark Office*